United States Patent
Atout

(10) Patent No.: US 8,947,148 B2
(45) Date of Patent: Feb. 3, 2015

(54) HYBRID ANALOG/DIGITAL POINT-OF-LOAD CONTROLLER

(71) Applicant: Analog Devices Technology, Hamilton (BM)

(72) Inventor: Kareem Atout, Kanata (CA)

(73) Assignee: Analog Devices Technology, Hamilton (BM)

( * ) Notice: Subject to any disclaimer, the term of this patent is extended or adjusted under 35 U.S.C. 154(b) by 0 days.

(21) Appl. No.: 14/162,297

(22) Filed: Jan. 23, 2014

(65) Prior Publication Data

US 2014/0266377 A1 Sep. 18, 2014

Related U.S. Application Data

(60) Provisional application No. 61/800,279, filed on Mar. 15, 2013.

(51) Int. Cl.
*H03K 3/00* (2006.01)
*H03K 3/011* (2006.01)

(52) U.S. Cl.
CPC ................................ *H03K 3/011* (2013.01)
USPC .............. 327/295; 327/296; 327/35; 327/176

(58) Field of Classification Search
USPC .............. 327/35, 36, 175, 176, 291, 295–297
See application file for complete search history.

(56) References Cited

U.S. PATENT DOCUMENTS

2004/0135608 A1 * 7/2004 Pillay et al. ................... 327/175

* cited by examiner

*Primary Examiner* — An Luu
(74) *Attorney, Agent, or Firm* — Patent Captial Group

(57) ABSTRACT

In one example, there is disclosed a hybrid analog-digital point-of-load controller (ADPOL) for use in a power supply. The ADPOL is configured to respond to transient current loads. In the presence of moderate current transients, power is clocked by a digital power core, which may be programmatically configured to adjust pulse width in response to the transient. In the presence of larger current transients, control may be passed to an analog transient compensator, which includes high-speed circuitry selecting between a very high-duty-cycle clock and a very low-duty-cycle clock, which will drive the transient back to the digital control domain.

20 Claims, 6 Drawing Sheets

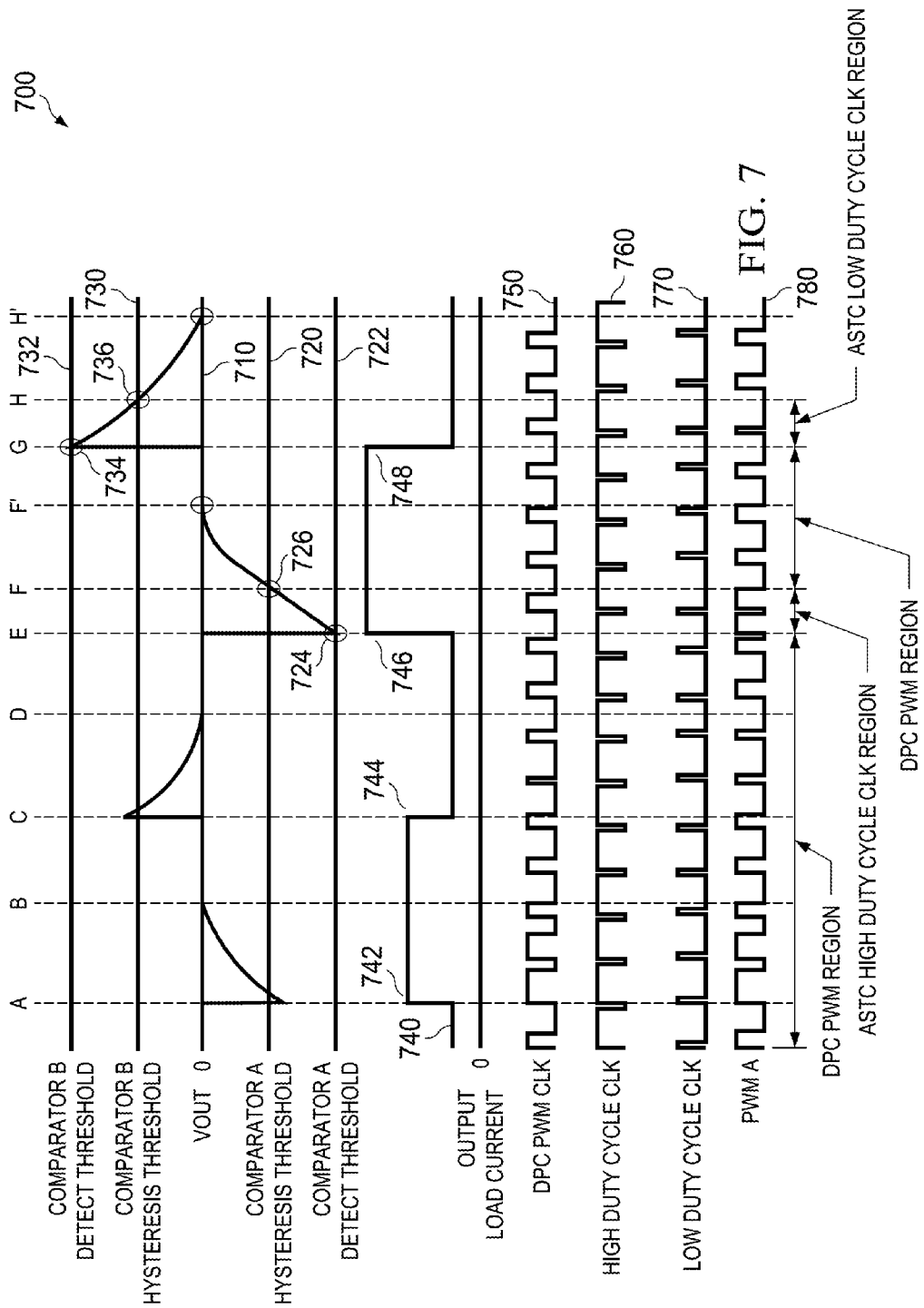

ized description when read with the accompanying

HYBRID ANALOG/DIGITAL POINT-OF-LOAD CONTROLLER

CROSS-REFERENCE TO RELATED APPLICATIONS

This application claims priority to U.S. Provisional Application 61/800,279, filed 15 Mar. 2013, which is incorporated by reference in its entirety.

FIELD OF THE DISCLOSURE

This application relates to the field of power control, and more particularly to a hybrid analog-digital point-of-load controller for an intelligent voltage source.

BACKGROUND

In certain electrical configurations, it is desirable to maintain a substantially constant output voltage. This may be the case, for example in a power supply, power stage, power conditioner, voltage source, or other similar circuit, which are all referred to collectively herein as a "voltage source." A theoretical ideal voltage source has infinite input impedance, zero output impedance, infinite current capacity, and infinite slew rate so that it can theoretically provide a constant output voltage v (for direct current) or v(t) (for alternating current), regardless of the load current being drawn. For convenience, the actual output voltage of a voltage source, whether alternating current or direct current, may be referred to throughout this specification as $V_{out}$, and the ideal output voltage may be referred to as $V_0$.

As a practical matter, a voltage source provides an imperfect time- or frequency-varying voltage. In the frequency domain, the output voltage may be described as $V_{out}=V(s)=V_0+T_d(s)+K$, where $T_d(s)$ represents a frequency-variant disturbance function and K represents a constant offset value. Both $T_d(s)$ and K may depend both on factors internal to the voltage source and external to the voltage source. Internal factors include for example leakage, internal noise, and offsets. External factors include for example timing, power demands including current transients, and feedback. $T_d(s)$ may also be dependent on noise in the circuit.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 7 is a timing diagram disclosing responses to voltage transients according to one or more example embodiments of the present specification.

DETAILED DESCRIPTION OF THE EMBODIMENTS

Overview

Figure 1:
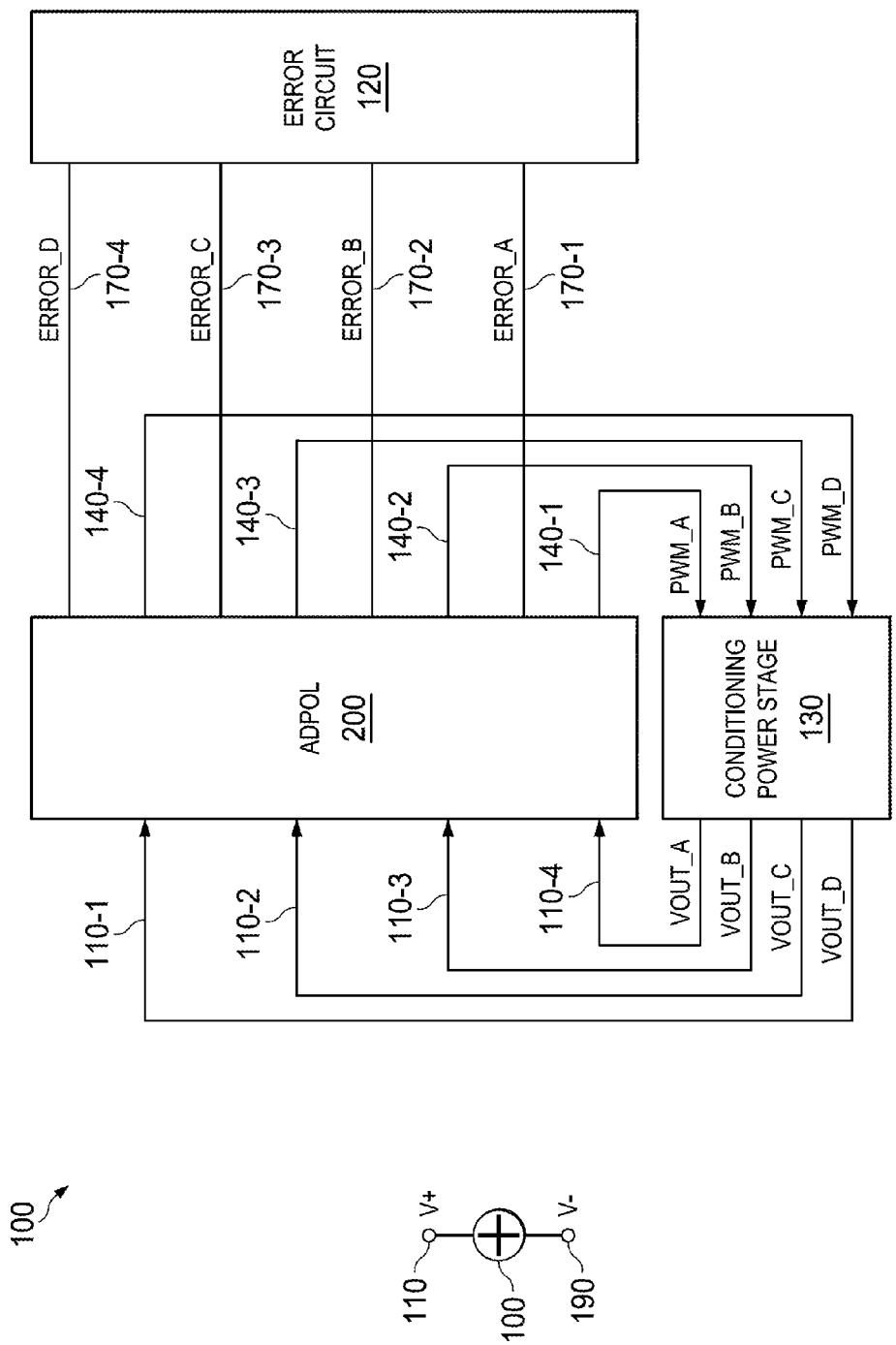
FIG. 1 is a block diagram of an intelligent voltage source according to one or more example embodiments of the present specification.

In one example, there is disclosed a hybrid analog-digital point-of-load controller (ADPOL) for use in a power supply. The ADPOL is configured to respond to transient current loads. In the presence of moderate current loads, power is clocked by a digital power core, which may be programmatically configured to adjust pulse width in response to the transient load. In the presence of larger current loads, control may be passed to an analog transient compensator, which includes high-speed circuitry selecting between a very high-duty-cycle clock and a very low-duty-cycle clock, which will drive the transient back to the digital control domain.

In another example, there is disclosed a hybrid analog-digital point-of-load controller for regulating an output voltage comprising: a programmable digital power core (DPC) configured to sense the output voltage, compare the output voltage to a reference voltage, and provide a DPC clock output; an analog transient compensator (ATC) configured sense the output voltage, and comprising: a clock generator configured to generate a high-duty-cycle clock and a low-duty-cycle clock; and a first selector logic operable to select an ATC clock comprising either the high-duty-cycle clock or the low-duty-cycle clock responsive to the output voltage; and a second selector logic for selecting between the DPC clock and the ATC clock.

In yet another example, there is disclosed a high-speed analog transient compensator (ATC) for use in a hybrid analog-digital point-of-load controller comprising: a clock generator configured to generate a high-duty-cycle clock and a low-duty-cycle clock; a first selector logic operable to select an ATC clock comprising either the high-duty-cycle clock or the low-duty-cycle clock responsive to a sensed output voltage; and a second selector logic for selecting between the ATC clock and a second clock received from an external source.

Example Embodiments of the Disclosure

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed.

Different embodiment many have different advantages, and no particular advantage is necessarily required of any embodiment.

In designing a voltage source, it may be desirable to minimize $T_d(s)$ and K so that the actual value of $V_{out}$ approaches its theoretical ideal as nearly as possible. One source of disturbance is transient loads. If a load suddenly begins drawing more current, or suddenly begins drawing less current, the output voltage may stray from its nominal value.

A digital point of load controller (DPOL) may be used to reduce or minimize undesirable variations in $V_{out}$. An example DPOL may provide a feed-forward configuration, in which large voltage transients are detected and ameliorated by modulation of a pulse width. For example, a large transient or sudden increase in current draw may cause $V_{out}$ to drop from its nominal level. Conversely, a transient or sudden drop in current draw may cause $V_{out}$ to rise above its nominal level. The DPOL may detect these changes in current draw and, responsive to the detected change, vary the duty cycle of a clock signal to compensate. For example, if the current increases (causing voltage to drop), a high-duty-cycle pulse width may be applied. If the current decreases (causing voltage to rise), a low-duty-cycle pulse width may be applied.

In some embodiments, a purely digital (i.e., processor-controlled) solution may not respond quickly enough to current transients to be acceptable. Specifically, a digital compensator block may try to correct for a current transient by computing the necessary changes to the duty cycle. The time to process the analog signal into a digital form, compute the necessary reactive changes, and effect those changes may exceed the design parameters of some modern systems. During this computation time, unacceptable voltage undershoots or overshoots may occur. Yet it is often desirable to provide the flexibility of digital control, even in many cases where high-speed compensation is necessary.

In an example embodiment of the present specification, a hybrid analog-digital point-of-load controller (ADPOL) is disclosed, including a digital power core (DPC) for normal operating conditions and small transients, and an analog transient compensator (ATC) for larger transients. This combination provides for fast transient response times along with the design and control flexibility of digital controllers.

FIG. 1 is a block diagram of an intelligent voltage source 100 according to one or more example embodiments of the present specification, referred to in this embodiment as voltage source 100. In an example, voltage source 100 has a positive node $V^+$ 110 and a negative node $V^-$ 190. $V^+$ 110 and $V^-$ 190 both have many possible values. By convention, $V^+$ 110 is spoken of as being the most "positive" voltage and $V^-$ 190 is spoken of as being the most "negative" voltage. Thus, under appropriate circumstances, either $V^+$ or $V^-$ could be considered a "supply" or "positive" voltage, and under other circumstances, either $V^+$ or $V^-$ could be considered a "ground," "negative," or "negative supply" voltage. It should be noted that $V^-$ 190 need be neither an absolute ground ("earth" or "chassis"), nor necessarily negative with respect to earth or chassis ground. Furthermore, "positive" and "negative" may be understood to refer simply to two opposite sides of a difference in potential. Thus, where a signal has a "positive side" and a "negative side," this may be construed generally to mean that the positive side of the signal includes those portions above a reference voltage, while the negative side of the signal includes those portions below the reference voltage. In some embodiments, a zero point is defined at earth ground or chassis ground and $V^+$ 110 and $V^-$ 190 may have values of substantially the same magnitude but opposite sign.

In an example embodiment, voltage source 100 provides four independent output voltages $V_{out}$, namely $V_{outA}$ 110-1, $V_{outB}$ 110-2, $V_{outC}$ 110-3, and $V_{outD}$ 110-4. Voltage source 100 includes a hybrid analog-digital point-of-load controller (ADPOL) 200, a conditioning and power stage 130, and an error circuit 120. In the example of FIG. 1, $V^-$ 190 is an earth or chassis ground, and all voltages are measures with respect to $V^-$ 190 unless otherwise noted. In this embodiment, voltage source 100 is configured to provide four independent output voltages, for example by providing four independent ADPOLs 200, which may be substantially identical to one another except for a reference voltage. Error circuit 120 receives error signals 170 from ADPOL 200, namely ERROR_A 170-1, ERROR_B 170-2, ERROR_C 170-3, and ERROR_D 170-4. Error circuit 120 may be configured, for example, to output a digital error signal warning higher-level systems of error conditions.

In another example embodiment, voltage source 100 provides a single digital four-phase power output, wherein each $V^+$ 110 provides a separate phase of the single power output. In this example, voltage source 100 may provide all four channels during peak load times, but switch off one or more phases during non-peak load times. Stated more generally, voltage source 100 may provide an n-phase digital power supply, and during peak load times, it may operate with all n phases. During non-peak load times, it may operate with only k phases, wherein k<n.

In this example, ADPOL 200 provides four pulse-width-modulated output clock signals 140, namely PWM_A 140-1, PWM_B 140-2, PWM_C 140-3, and PWM_D 140-4. Given an analog input $V_{out}$ 110, ADPOL 200 will provided a pulse-width-modulated digital output, wherein the duty cycle is linearly proportional to the average voltage of PWM 140. For example, if the received $V_{out}$ 110 is 12V, with a 50% duty cycle, PWM 140 will have an average voltage of 6V. PWM 140 feeds back to a power and conditioning stage 130, which may be configured to shape, amplify, or otherwise condition output clock signals into output voltages $V_{out}$, which are supplied as output voltages $V_{out}$ 110 and which are also supplied back to ADPOL 200. In one example, power and conditioning stage 130 is configured to receive PWM 140 as a square wave and provide a $V_{out}$ 110 as a substantially direct current steady-state voltage.

It should also be noted that while four phases of power output are disclosed herein by way of example, any number of power phases may be substituted without altering the spirit of the disclosure.

Figure 2:
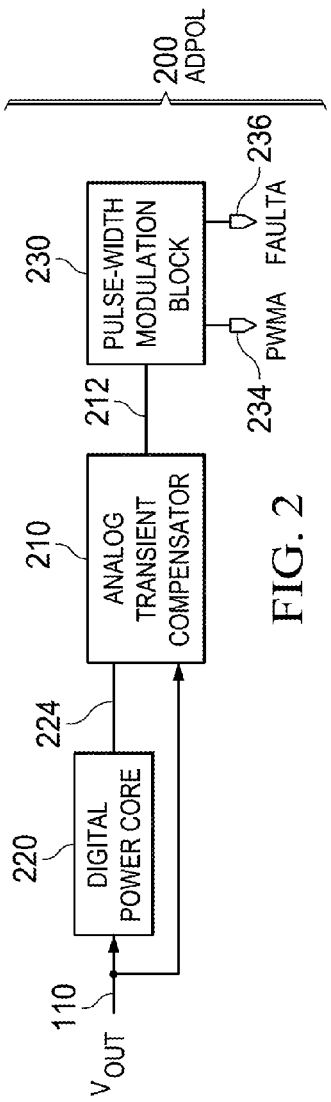
FIG. 2 is a block diagram of a hybrid analog-digital point-of-load controller according to one or more example embodiments of the present specification.

FIG. 2 is a block diagram of an ADPOL 200 according to one or more example embodiments of the present specification. It should be noted that only a single ADPOL 200 is shown in this figure to simplify the drawing, but according to the embodiment of FIG. 1, a plurality of ADPOLs 200 could be provided, and may be substantially identical. Example ADPOL 200 includes digital power core (DPC) 220, analog transient compensator 210, and pulse width modulation block 230. DPC 220 receives $V_{out}$ 222 as an input and is configured to detect changes in the current load on $V_{out}$ 222 and provide a DPC pulse-width-modulated signal (DPWM) 224 to analog transient compensator (ATC) 210. ATC 210 also receives $V_{out}$ 222 as an input. Based on both $V_{out}$ 222 and DPWM 224, ATC 210 provides a pulse-width-modulated clock signal 212 to pulse-width modulation block 230. Pulse-width modulation block 230 modulates modified clock signal 212, and provides an output signal called PWMA 234 and FAULTA 236. Note that outputs PWMB, FAULTB, PWMC, FAULTC, PWMD, and FAULTD are omitted for simplicity. In general terms, duty cycle selector 350 selects which of two possible pulse-width clocks (high-pulse-width or low-pulse-width) is provided to PWM selector 380, and PWM selector 380 selects whether to output the clock supplied by duty cycle selector 350, or to output the DPWM clock 224 supplied by DPC 220. In this specification, a "selector" is defined as a circuit, hardware, software, firmware, or combination thereof configured to receive a plurality of inputs and to selectively output one or more of the plurality of inputs subject to a control signal.

In an example embodiment, during steady state operation and under lesser current transient conditions, ADPOL 200 is controlled exclusively by DPC 220, which provides greater programmability and flexibility. Under greater current transient conditions, ADPOL 200 is controlled by ATC 210, which provides greater speed.

Figure 3:
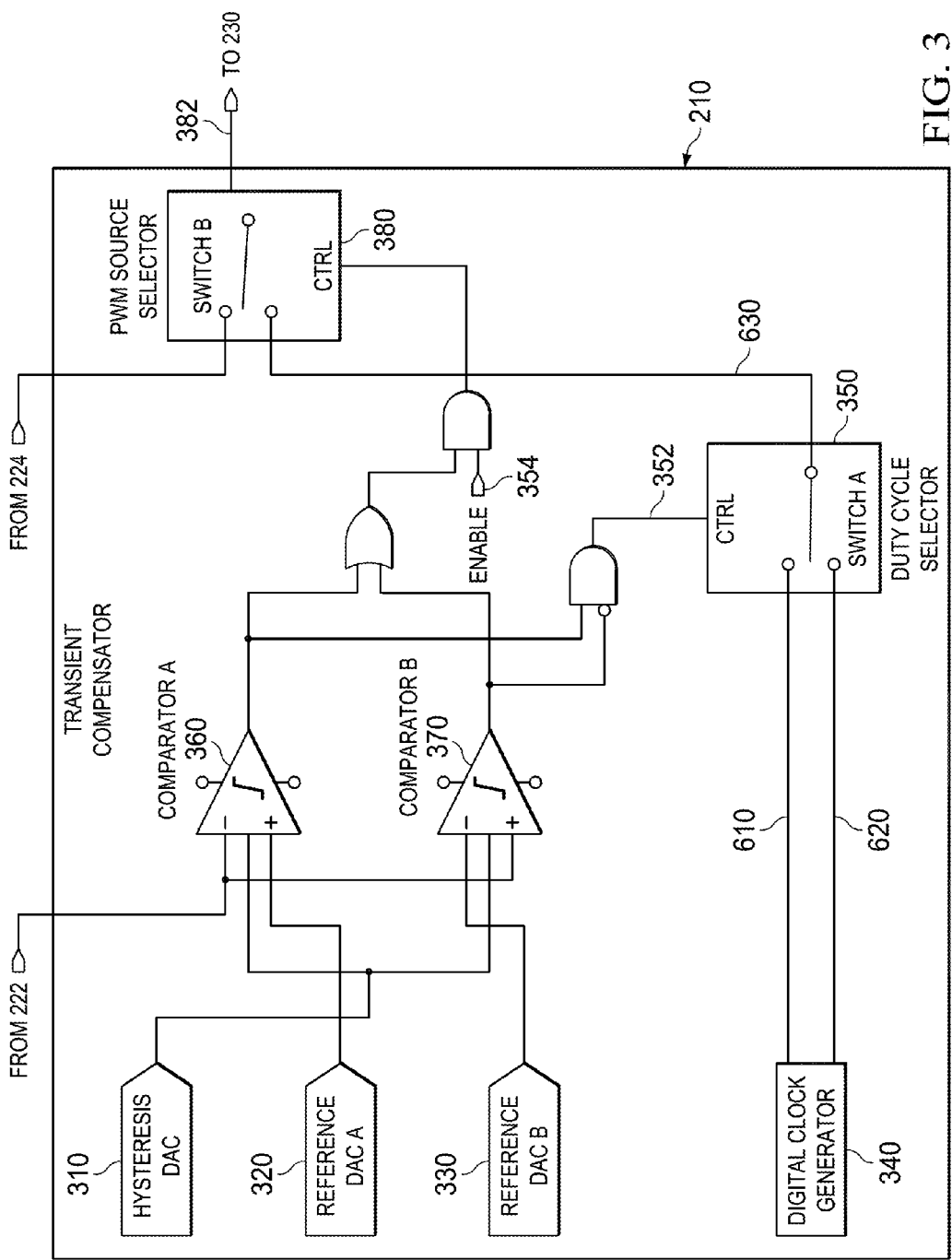
FIG. 3 is a block diagram of an analog transient compensator according to one or more example embodiments of the present specification.

FIG. 3 is a block diagram of ATC 210. In an example, ATC 210 is configured to control ADPOL 200 under greater transient loads where, for example, higher speed is desirable over greater flexibility. To that end, ATC 210 is built in one example with high-speed analog components, including a hysteresis DAC 310, reference DAC A 320, reference DAC B 330, digital clock generator 340, duty cycle selector 350, comparator A 360, comparator B 370, and PWM source selector 380.

Figure 6:
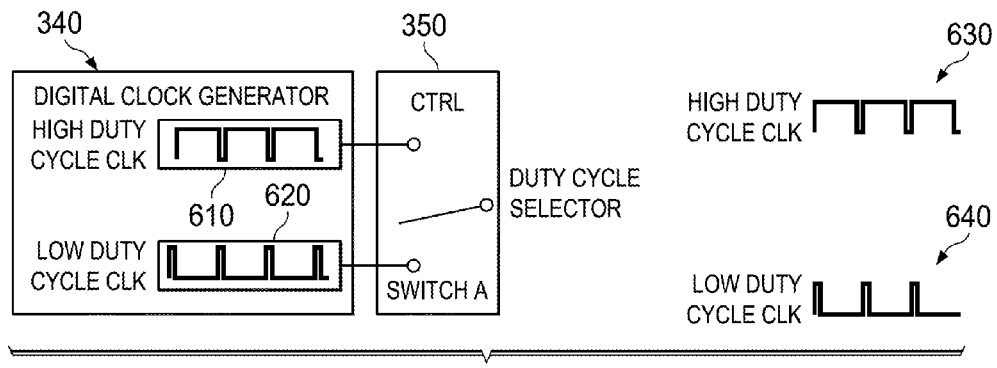
FIG. 6 is a block diagram of a digital clock generator according to one or more example embodiments of the present specification.

In an example, digital clock generator 340 is configured to provide two output clocks, a high-duty-cycle clock and low-duty-cycle clock. FIG. 6 discloses a more detailed view of digital clock generator 340, in which a high-duty-cycle clock generator 610 and low-duty-cycle clock generator 620 are visible. Both clock generators may derive their signals from and synchronize with DPWM 224. Specifically, the clock generators may switch at the same frequency as DPWM 224, and have their leading edges aligned with the leading edge of DPWM 224. But while DPWM 224 may have a duty cycle on the order of 50%, the clocks output by digital clock generator 340 are, by design, not balanced in this example. In one embodiment, high-duty-cycle clock may have a duty cycle of approximately 95%, or within the range of approximately 70% to less than 100%. Low-duty cycle clock may have a duty cycle of approximately 5%, or within the range of greater than 0% to approximately 30%. Digital clock generator outputs selected clock signal 630. In this specification, "clock generator" is expressly defined as any circuit, or combination of hardware or software configured to output a clock signal. A "clock signal" is expressly defined in this specification as a signal having substantially two levels occurring in a time-varying pattern. Further, although two separate clock generators are disclosed herein by way of example, additional configurations can be easily substituted. For example, a single dual-channel clock generator may be used.

In an example, duty cycle selector 350 may be configured to receive high-duty-cycle clock 610 and low-duty-cycle clock 620, and is controlled by a select signal 352. Select signal 352 is derived from combinatorial logic. Specifically, comparator A 360 receives $V_{out}$ 222 and reference A 320 as inputs. Formally, $A=V_{out}-\Delta\downarrow$ where $\Delta\downarrow$ is the undershoot threshold. Similarly, comparator B 370 receives $V_{out}$ 222 and reference B 330 as inputs. Formally, $B=V_{out}+\Delta\uparrow$, where $\Delta\uparrow$ is the overshoot threshold.

In another example embodiment, comparator A 360 and comparator B 370 may also receive as inputs a digitally programmable hysteresis from hysteresis DAC 310. This value may be adjusted for both voltage width and offset to enable asymmetric positioning.

Duty cycle selection circuit 350 is controlled by the value $A \times \overline{B}$, outputting selected clock signal 630. Further, the value $A+B$, subject to an enable signal 354, may drive the selection of PWM source selector 380, which receives selected clock signal 630 as one input, and signal DPWM 224 from DPC 224 as the other. PWM source selector 380 outputs clock 382, which is the result of the selection. Enable signal 354 is provided to optionally allow ADPOL 200 to operate completely under DPC 220 if necessary or desired.

The result of the foregoing logic is that ATC 210 provides three modes of operation:

a. During "normal" operation, including operation in which a transient event exceeds the hysteresis threshold but does not exceed $\Delta\downarrow$ for overcurrent events and $\Delta\uparrow$ for undercurrent events, DPWM 224 is selected as the output of clock 382.

b. During "undershoot" conditions, wherein the transient magnitude exceeds $\Delta\downarrow$, high-duty-cycle clock 630 is selected as the output of clock 382.

c. During "overshoot" conditions, wherein the transient magnitude exceeds $\Delta\uparrow$, low-duty-cycle clock 640 is selected as the output of clock 382.

Figure 4:
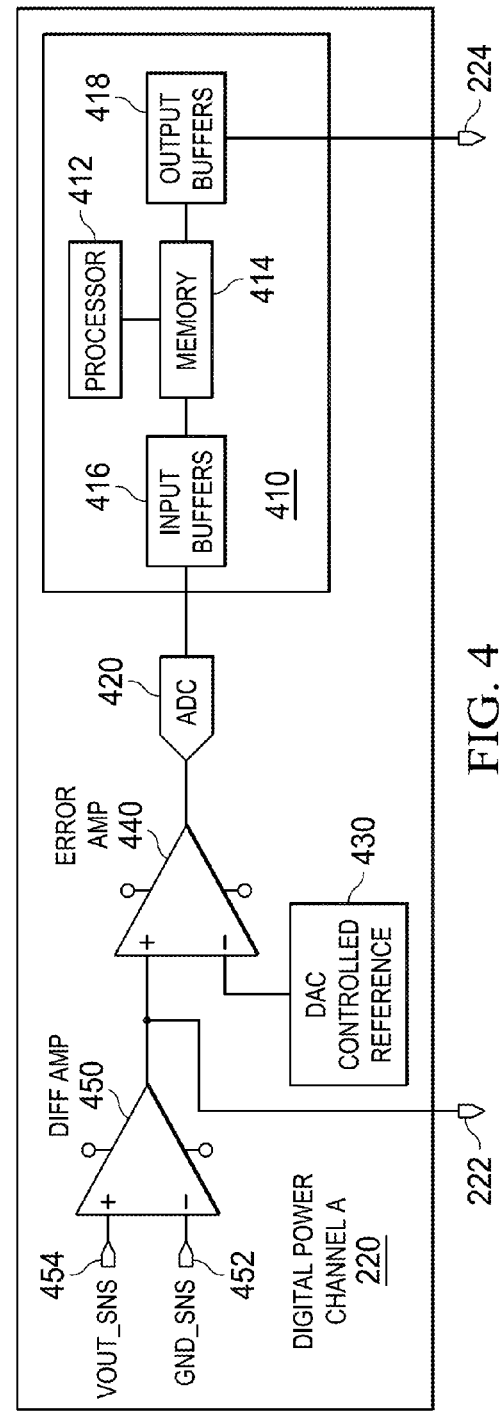
FIG. 4 is a block diagram of a digital power channel according to one or more example embodiments of the present specification.

FIG. 4 is a block diagram of DPC 220 according to an example embodiment of the present specification. In this example, a differential amplifier 450 receives VOUT_SNS 454 and GND_SNS 452, which may be driven by $V_{out}$ 110 and V⁻ 190 respectively. Taking GND_SNS 452 as the zero-node of the circuit, differential amplifier 454 can be described as detecting and amplifying the magnitude of VOUT_SNS 454. The output of differential amplifier 450 is intermediate $V_{out}$ 222, which is used by both DPC 220 and ATC 210.

An error amplifier 440 is provided, and compares intermediate $V_{out}$ 222 to DAC-controlled reference 430. DAC-controlled reference 430 is provided so that $V_{out}$ 222 can be dynamically adjusted according to power needs. This may be adjusted, for example, in software. The result is provided to analog-to-digital converter (ADC) 420. ADC 420 provides a digital output representing intermediate $V_{out}$ 222 to digital compensator 410. Digital compensator 410 may include, for example a processor 412, memory 414, and input buffers 416, and output buffers 418. In an example, processor 412 may receive a digital $V_{out}$ via input buffers 416, and responsive to a detected transient, compute a digital clock signal with a high duty cycle (to compensate for undershoot events) or a low duty cycle (to compensate for overshoot events). Processor 412 may then drive this clock signal on an output buffer 418, where it is provided as clock signal DPWM 224. Software, firmware, or microcode instructions to effect these functions may be stored in memory 414.

In one example embodiment, the logic for digital compensator 410 provides a three-zero, three-pole function. In practice, the closed-loop bandwidth of this function is limited by the processing speed (instructions-per-second) of digital compensator 410. Digital compensator 410 may be configured to provide real-time response to dynamic power demands. For example, in a high-capacity server, above a given threshold it may be more efficient to provide multi-phase power, as shown in FIG. 1. In one example, the threshold is approximately 25 amperes. However, during non-peak loads, providing multi-phase power may be inefficient. Thus, it may be beneficial to provide only one phase of power, or at least fewer than all four phases of power (called "phase shutting"). This increases efficiency because the additional phases consume power to remain in an "idle" state, even when not actively supplying power or when supplying only a little power.

Advantageously, ADPOL 200 realizes increased speed because ATC 210 is able to respond to large voltage transients in near-real-time. Further, the high-speed circuitry of ATC 210 can toggle between overshoot and undershoot states very quickly because in one example embodiment, there are no poles or zeros in the control design of ATC 210, which enables very wide bandwidth.

In an example, ADPOL 200 may be required to transition smoothly from the analog domain, under the control of ATC 210, and return to the digital domain, under the control of the DPC 220, once a large load transient event settles. Thus, in one example, ADPOL 200 may be designed to self-calibrate and store duty cycle information under different load conditions, where values for both current and voltage are known. This is possible because ADPOL 200 may be configured to sense input current, input voltage, output current, and output voltage, and DPC 220 may be configured to always know what its duty cycle is because it is generated digitally.

When ADPOL 200 transitions back from ATC 210 to DPC 220, intermediate $V_{out}$ 222 may be known because ADPOL 200 already has the values of the detection hysteresis thresholds stored in its memory, for example in hysteresis DAC 310. The voltage, current and duty cycle values obtained during calibration may then be used to generate a set of data tables or curves in order to map the relationship of output voltage and current to duty cycle.

In the digital domain, DPC 220 may then select, from the mapped data, the closest duty cycle and generate this upon re-entry from the analog domain. After a programmable number of pulses, DPC 220 may context switch to its normal mode of regulation and generate the required duty cycle to maintain tight regulation of intermediate $V_{out}$ 222.

ADPOL 200 may also add time constants and blanking to transition points in order to allow for increased flexibility and tuning of the response to large transients.

Figure 5:
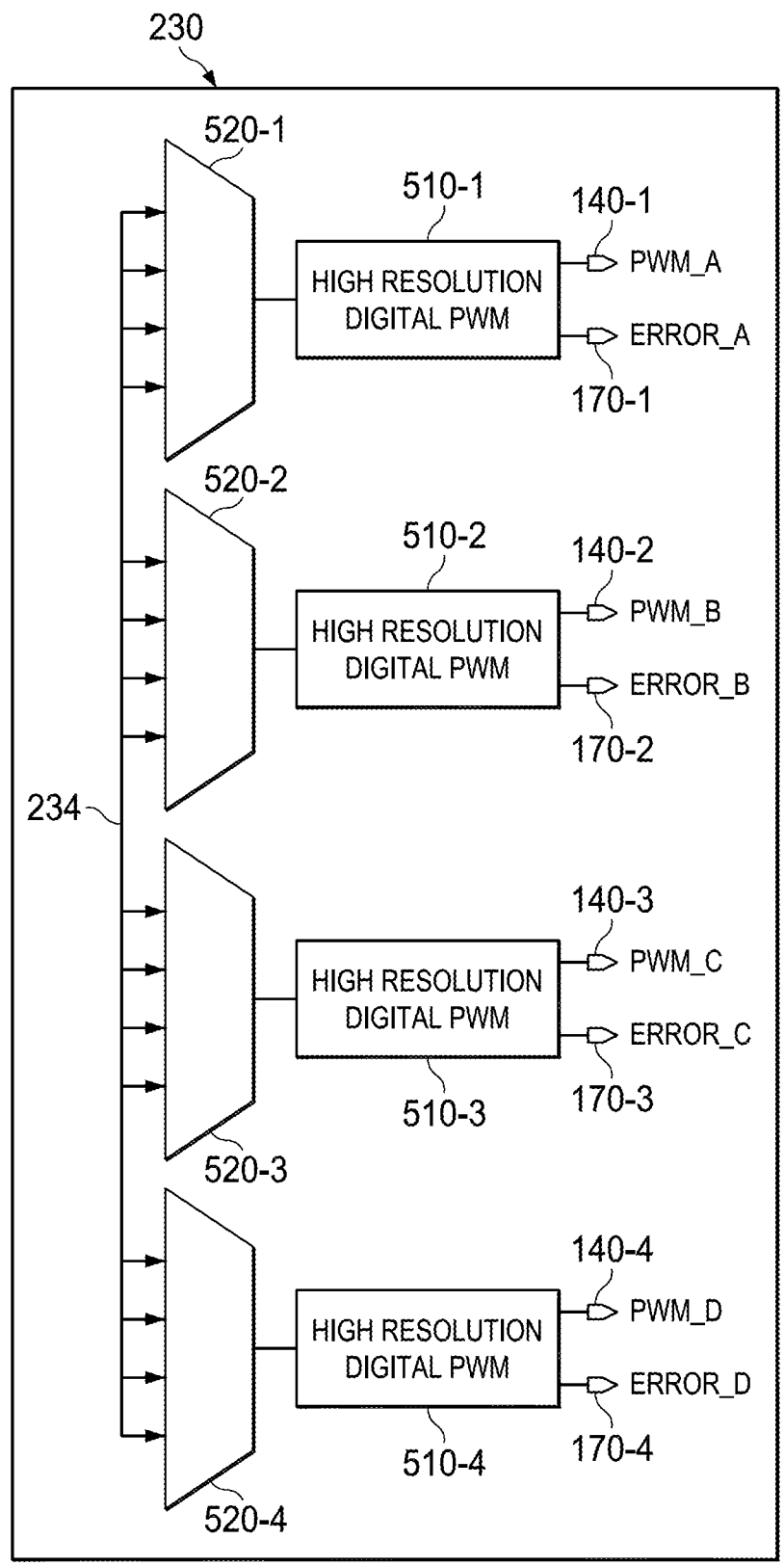
FIG. 5 is a block diagram of a pulse-width modulation block according to one or more example embodiments of the present specification.

FIG. 5 is a block diagram of pulse width modulation block 230. Pulse width modulation block 230 may be configured to condition power signals by, for example, adjusting amplitude to drive conditioning power stage 130. In this example, a plurality of multiplexers 520-1-5 are provided, each selecting one of the four outputs PWMA 234 as shown in FIG. 2. (Note that for simplicity, FIG. 1 shows only one of the four power stages described in FIG. 1). Each output PWMA 234 is provided to each multiplexer 520, which provides flexibility in selecting which output PWMA 234 is routed to which pulse width modulator 530. Pulse width modulators 530-1-5 are high-resolution digital pulse-width modulators. Digital pulse width modulators 510 then provide pulse-width modulated outputs 140 and error signals 170.

FIG. 7 provides a timing diagram 700 disclosing operation of ADPOL 200 in an example embodiment of the present specification. In this example, $V_{out}$ is provided at a nominal level 710. Comparator A hysteresis threshold 720 is provided as a level at which DPC 220 may attempt to correct undershoot conditions by digitally selecting a high-duty-cycle DPWM 224. Comparator A detect threshold 722 is provided as a level at which ATC 210 may assume control of ADPOL 210 and attempt to correct a voltage undershoot condition by selecting high-duty-cycle clock 610. Comparator B hysteresis threshold 730 is provided as a level at which DPC 220 may assume control of ADPOL 210 and attempt to correct a voltage overshoot condition by digitally selecting a low-duty-cycle DPWM 224. Comparator B detect threshold 732 is provided as a level at which ATC 210 may assume control of ADPOL 210 and attempt to correct a voltage overshoot by selecting low-duty-cycle clock 620.

Signal 740 is an example output load current, referenced to zero, experienced by DPOL 200, including several transients 742, 744, 746, 748. Signal 750 is a timing diagram of DPWM 224 under the example conditions. Signal 760 is a timing diagram of high-duty-cycle clock 610 under the example conditions. Signal 770 is a timing diagram of low-duty-cycle clock 620 under the example conditions. Signal 780 is an example PWM 140.

For convenience of reference, timing diagram 700 is divided into regions A-H, divided by labeled cursors, which are described as follows.

In region A-B a small positive current transient 742 occurs, specifically exceeding in magnitude comparator A hysteresis threshold 720. At cursor A, difference amplifier 450 senses that $V_{out}$ 222 has started to drop because of transient 742. DPC 220 begins to compensate for this voltage deviation by digitally increasing the duty cycle of DPWM 224. Because transient 742 does not exceed comparator A detect threshold 722, PWM source selector 380 continues to provide DPWM 224 as clock 382. By increasing the duty cycle of DPWM 224, DPC 220 successfully compensates for the transient drop in $V_{out}$ 222. As $V_{out}$ 222 begins returning to its nominal value 710, DPC 220 begins to reduce the clock cycle of DPWM 224 to its nominal value. At cursor B, $V_{out}$ 222 has returned to its nominal value 710.

In region C-D, a small negative current transient 744 occurs, specifically exceeding in magnitude comparator B hysteresis threshold 730. At cursor C, difference amplifier 450 senses that $V_{out}$ 222 has started to rise because of transient 744. DPC 220 begins to compensate for this voltage deviation by digitally decreasing the duty cycle of DPWM 224. Because transient 744 does not exceed comparator B detect threshold 732, PWM source selector 380 continues to provide DPWM 224 as clock 382. By decreasing the duty cycle of DPWM 224, DPC 220 successfully compensates for the transient rise in $V_{out}$ 222. As $V_{out}$ 222 begins returning to its nominal value 710, DPC 220 begins to increase the clock cycle of DPWM 224 to its nominal value. At cursor D, $V_{out}$ 222 has returned to its nominal value 710.

In region E-F a large positive current transient 746 occurs, specifically exceeding in magnitude comparator A detect threshold 722 at peak 724. At cursor E, difference amplifier 450 senses that $V_{out}$ 222 has started to drop because of transient 746. Because transient 746 exceeds comparator A detect threshold 722, PWM source selector 380 selects selected clock signal 630 as clock 382. Because transient 746 exceeds comparator A detect threshold 722, selected clock signal 630 is high-duty-cycle clock 610. High-duty-cycle clock 610 quickly drives $V_{out}$ 722 back towards its nominal value 710. At point 726, transient 746 crosses back over comparator A hysteresis threshold 720. At point 726, control of clock 382 passes back to DPC 220, which will digitally select DPWM 224. As $V_{out}$ 222 continues towards its nominal value 710, DPC 220 begins to reduce the clock cycle of DPWM 224 to its nominal value. At cursor F', $V_{out}$ 222 has returned to its nominal value 710.

In region G-H a large negative current transient 748 occurs, specifically exceeding in magnitude comparator B detect threshold 732 at peak 734. At cursor G, difference amplifier 450 senses that $V_{out}$ 222 has started to drop because of transient 748. Because transient 748 exceeds comparator B detect threshold 732, PWM source selector 380 selects selected clock signal 630 as clock 382. Because transient 748 exceeds comparator B detect threshold 732, selected clock signal 630 is low-duty-cycle clock 620. Low-duty-cycle clock 620 quickly drives $V_{out}$ 722 back towards its nominal value 710. At point 736, transient 748 crosses back over comparator B hysteresis threshold 730. At point 736, control of clock 382 passes back to DPC 220, which will digitally select DPWM 224. As $V_{out}$ 222 continues towards its nominal value 710, DPC 220 begins to raise the clock cycle of DPWM 224 to its nominal value. At cursor H', $V_{out}$ 222 has returned to its nominal value 710.

Figure 8:
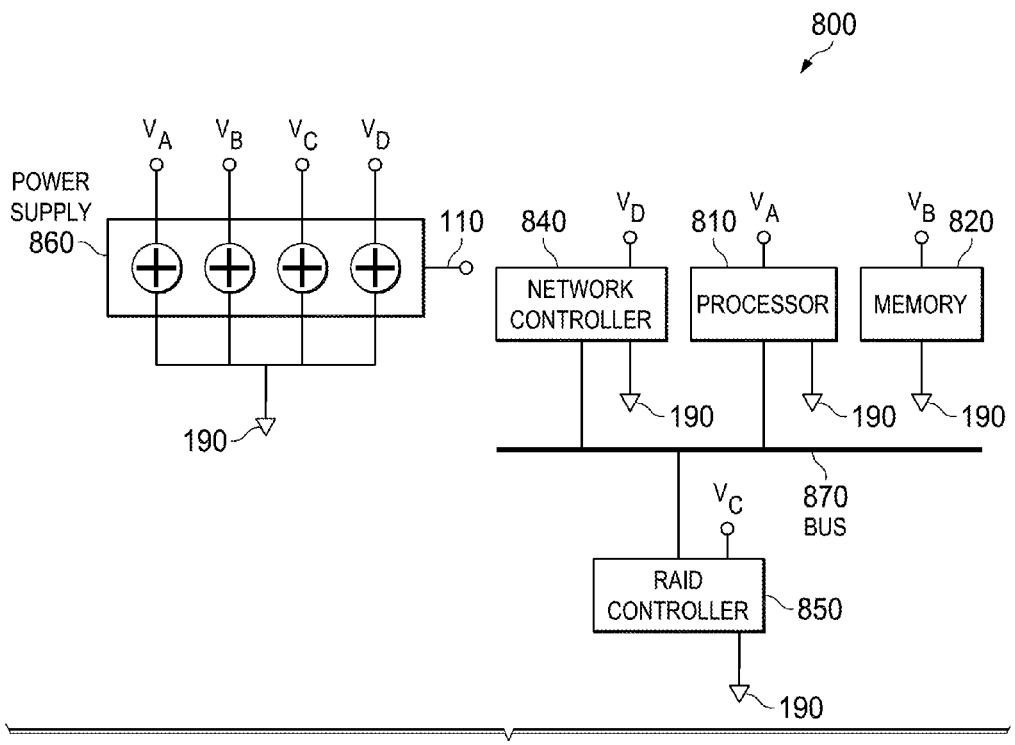
FIG. 8 is a block diagram of a network element employing an intelligent voltage source according to one or more example embodiments of the present specification.

FIG. 8 is a block diagram of a network device 800 according to one or more example embodiments of the present specification. Network device 800 may have a specific demand for an intelligent power supplies, particularly in cases where network device 800 is a large device drawing high power and having high-reliability requirements. In certain embodiments, network device 800 may be, by way of non-limiting example, a mainframe, gateway, router, fiberoptic router, bridge, web server, hub, switch, firewall, network address translator, repeater, network-attached storage device, telecommunication transceiver, or other telecommunication device. In some cases, network device 800 may need to be configurable for real-time adjustment to dynamic power demands. For example, during peak operational periods, network device 800 may have greater power demands than during non-peak periods. Thus, there may be a need to dynamically and programmatically respond to power demands on network device 800.

In an example, network device 800 includes a power supply 860 providing power to a plurality of subsystems communicatively coupled to one another via system bus 870. Systems that draw power from power supply 860 may include, by way of non-limiting example, processor 810, memory 820, RAID controller 850, and network controller 840. Power supply 860 receives the output voltage $V_{out}$ 110 from voltage source 100, referenced to a chassis ground 190. Note that in this example, $V_{out}$ 110 may be only one phase of a multi-phase voltage source 100, or may receive power from up to all of the phases from voltage source 100. In yet another example, bus 870 may be a power bus, and may distribute power to the foregoing systems.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Note that the digital control functions discussed above with reference to the FIGURES are applicable to and may be carried out by any integrated circuits that involve signal processing, particularly those that can execute specialized software programs or algorithms, some of which may be associated with processing digitized real-time data. Certain embodiments can relate to multi-DSP signal processing, floating point processing, signal/control processing, fixed-function processing, microcontroller applications, etc.

In certain contexts, the hybrid analog/digital point-of-load controller described herein may be used in a power supply, including a switching power supply, for medical systems, scientific instrumentation, wireless and wired communications, radar, industrial process control, audio and video equipment, current sensing, instrumentation (which can be highly precise), and other digital-processing-based systems. Moreover, certain embodiments discussed above can be provisioned in medical imaging, patient monitoring, medical instrumentation, and home healthcare products. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc., which may require highly-stable and predictable power supplies. In yet other example scenarios, the teachings of the present disclosure can be applicable in the industrial markets that include process control systems that help drive productivity, energy efficiency, and reliability. In consumer applications, the teachings of the controller discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily be part of smartphones, tablets, security systems, PCs, gaming technologies, virtual reality, simulation training, etc.

The particular embodiments of the present disclosure may readily include a system on chip (SOC) central processing unit (CPU) package. An SOC represents an integrated circuit (IC) that integrates components of a computer or other electronic system into a single chip. It may contain digital, analog, mixed-signal, and radio frequency functions: all of which may be provided on a single chip substrate. Other embodiments may include a multi-chip-module (MCM), with a plurality of chips located within a single electronic package and configured to interact closely with each other through the electronic package. In various other embodiments, the digital signal processing functionalities may be implemented in one or more silicon cores in Application Specific Integrated Circuits (ASICs), Field Programmable Gate Arrays (FPGAs), and other semiconductor chips.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Additionally, some of the components associated with described microprocessors may be removed, or otherwise consolidated. In a general sense, the arrangements depicted in the figures may be more logical in their representations, whereas a physical architecture may include various permutations, combinations, and/or hybrids of these elements. It is imperative to note that countless possible design configurations can be used to achieve the operational objectives outlined herein. Accordingly, the associated infrastructure has a myriad of substitute arrangements, design choices, device possibilities, hardware configurations, software implementations, equipment options, etc.

Any suitably-configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, a field programmable gate array (FPGA), an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof. In operation, processors may store information in any suitable type of non-transitory storage medium (for example, random access memory (RAM), read only memory (ROM), field programmable gate array (FPGA), erasable programmable read only memory (EPROM), electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe. Any of the memory items discussed herein should be construed as being encompassed within the broad term 'memory.' Similarly, any of the potential processing elements, modules, and machines described herein should be construed as being encompassed within the broad term 'microprocessor' or 'processor.'

Computer program logic implementing all or part of the functionality described herein is embodied in various forms, including, but in no way limited to, a source code form, a computer executable form, and various intermediate forms (for example, forms generated by an assembler, compiler, linker, or locator). In an example, source code includes a series of computer program instructions implemented in various programming languages, such as an object code, an assembly language, or a high-level language such as OpenCL, Fortran, C, C++, JAVA, or HTML for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

In the discussions of the embodiments above, the capacitors, buffers, graphics elements, interconnect boards, clocks, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, non-transitory software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In another example embodiment, the electrical circuits of the FIGURES may be implemented as stand-alone modules (e.g., a device with associated components and circuitry configured to perform a specific application or function) or implemented as plug-in modules into application specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "steps for" are specifically used in the particular claims; and (b) does not intend, by any statement in the specification, to limit this disclosure in any way that is not otherwise reflected in the appended claims.

What is claimed is:

1. A hybrid analog-digital point-of-load controller for regulating an output voltage comprising:
    a programmable digital power core (DPC) configured to sense the output voltage, compare the output voltage to a reference voltage, and provide a DPC clock output;
    an analog transient compensator (ATC) configured to sense the output voltage, and comprising:
        a clock generator configured to generate a high-duty-cycle clock and a low-duty-cycle clock; and
        a first selector logic operable to select an ATC clock comprising either the high-duty-cycle clock or the low-duty-cycle clock responsive to the output voltage; and
    a second selector logic for selecting between the DPC clock and the ATC clock.

2. The hybrid analog-digital point-of-load controller of claim 1, wherein the first selector logic is configured to select the high-duty-cycle clock in the case of a large negative transient voltage event, and to select the low-duty-cycle clock in the case of a large positive transient voltage event.

3. The hybrid analog-digital point-of-load controller of claim 1, wherein in the presence of a positive voltage transient with a magnitude above a first threshold and below a second threshold:
    the DPC is configured to provide a reduced-duty-cycle DPC clock; and
    the second selector logic is configured to select the DPC clock.

4. The hybrid analog-digital point-of-load controller of claim 3, wherein the first threshold is a hysteresis value.

5. The hybrid analog-digital point-of-load controller of claim 3, wherein in the presence of a positive voltage transient with a magnitude above the second threshold:
the first selector logic is configured to select the low-duty-cycle clock; and
the second selector logic is configured to select the ATC clock.

6. The hybrid analog-digital point-of-load controller of claim 1, wherein in the presence of a negative voltage transient with a magnitude above a third threshold and below a fourth threshold:
the second selector logic is configured to select the DPC clock; and
the DPC clock is configured to provide an increased-duty-cycle DPC clock.

7. The hybrid analog-digital point-of-load controller of claim 6, wherein the third threshold is a hysteresis value.

8. The hybrid analog-digital point-of-load controller of claim 6, wherein in the presence of a positive voltage transient with a magnitude above the fourth threshold:
the first selector logic is configured to select the high-duty-cycle clock; and
the second selector logic is configured to select the ATC clock.

9. A power supply comprising the hybrid digital-analog point-of-load controller of claim 1.

10. The power supply of claim 9 comprising a plurality of the hybrid analog-digital point-of-load controllers of claim 1, wherein the power supply is configured to switch at least one of the hybrid analog-digital point-of-load controllers to an inactive state during non-peak usage.

11. The power supply of claim 10, wherein the number of hybrid analog-digital point-of-load controllers is four.

12. A network device receiving power from the power supply of claim 9.

13. A high-speed analog transient compensator (ATC) for use in a hybrid analog-digital point-of-load controller comprising:

a clock generator configured to generate a high-duty-cycle clock and a low-duty-cycle clock;
a first selector logic operable to select an ATC clock comprising either the high-duty-cycle clock or the low-duty-cycle clock responsive to a sensed output voltage; and
a second selector logic for selecting between the ATC clock and a second clock received from an external source.

14. The high-speed analog transient compensator of claim 13, wherein the external source is a digital power core.

15. The high-speed transient compensator of claim 13, wherein the first selector logic is configured to select the high-duty-cycle clock in the case of a large negative transient voltage event, and to select the low-duty-cycle clock in the case of a large positive transient voltage event.

16. The high-speed transient compensator of claim 13, wherein in the presence of a negative voltage transient with a magnitude above a third threshold and below a fourth threshold, the second selector logic is configured to provide the clock received from the external source.

17. The high-speed transient compensator of claim 16, wherein in the presence of a negative voltage transient with a magnitude above the fourth threshold:
the first selector logic is configured to select the high-duty-cycle clock; and
the second selector logic is configured to select the ATC clock.

18. The high-speed transient compensator of claim 13, wherein in the presence of a positive voltage transient with a magnitude above a first threshold and below a second threshold, the second selector logic is configured to provide the clock received from the external source.

19. The high-speed transient compensator of claim 18, wherein in the presence of a positive voltage transient with a magnitude above the second threshold:
the first selector logic is configured to select the low-duty-cycle clock; and
the second selector logic is configured to select the ATC clock.

20. The high-speed transient compensator of claim 13, wherein the external source is a digital power core.

* * * * *